United States Patent [19]

Spiertz et al.

[11] 4,230,788
[45] Oct. 28, 1980

[54] METHOD OF MANUFACTURING AN EXTERNAL ELECTRICALLY CONDUCTING METAL PATTERN

[75] Inventors: Elisabeth J. Spiertz; Christiaan F. W. Flinsenberg; Leendert K. H. van Beek, all of Eindhoven, Netherlands

[73] Assignee: U.S. Philips Corporation, New York, N.Y.

[21] Appl. No.: 950,508

[22] Filed: Oct. 11, 1978

Related U.S. Application Data

[63] Continuation of Ser. No. 720,809, Sep. 7, 1976, abandoned, which is a continuation of Ser. No. 525,154, Nov. 19, 1974, abandoned.

[30] Foreign Application Priority Data

Nov. 26, 1973 [NL] Netherlands .......................... 7316102

[51] Int. Cl.$^2$ .......................... G03C 1/58; G03C 5/24
[52] U.S. Cl. ..................................... 430/153; 427/98; 427/304; 427/437; 430/311; 430/413; 430/477
[58] Field of Search ...................... 96/38.4, 48 PD, 49, 96/75, 91; 427/98, 145, 437, 304; 430/153, 311, 413, 414, 477

[56] References Cited

U.S. PATENT DOCUMENTS

| 3,223,525 | 12/1965 | Jonkers et al. | 96/49 X |
| 3,595,660 | 7/1971 | van Beek et al. | 96/49 |
| 3,615,483 | 10/1971 | Jonker et al. | 430/153 |
| 3,772,078 | 11/1973 | Polichette et al. | 96/48 PD X |
| 3,802,886 | 4/1974 | Spiertz et al. | 430/153 X |
| 3,960,564 | 6/1976 | Molenaar et al. | 96/48 PD |

FOREIGN PATENT DOCUMENTS

1236752 6/1971 United Kingdom .

*Primary Examiner*—Edward C. Kimlin
*Attorney, Agent, or Firm*—Norman N. Spain

[57] ABSTRACT

A method of making an electrically conducting metal pattern on a superficially non-conducting support which comprises imagewise exposing to light a photosensitive material containing either a diazosulfide or a diazosulfonate, which produces a light reaction product which is capable of forming free silver and mercury metal from water-soluble silver and mercurous compounds. A mixture of water and at least one solvent from the group consisting of chloroform, toluene, ethylacetate, liquid alcohols and ketones is used in the treatment of the exposed photosensitive material to form a latent image.

3 Claims, No Drawings

METHOD OF MANUFACTURING AN EXTERNAL ELECTRICALLY CONDUCTING METAL PATTERN

This is a continuation of application Ser. No. 720,809, filed Sept. 7, 1976 and now abandoned, said application Ser. No. 720,809 being in turn a continuaton of application Ser. No. 525,154, filed Nov. 19, 1974 and is now abandoned.

The invention relates to an additive method of manufacturing an external, electrically conducting metal pattern on a non-conducting hydrophobic support by photographic process, and to the product thus obtained.

It is known from UK Pat. No. 1,092,607 to manufacture a photosensitive material by providing an adhesive coating on a hydrophobic support and by adhering thereto the photosensitive material in the form of a vitreous coating. This vitreous coating is provided in the form of an aqueous solution comprising a diazosulfonate as a photosensitive compound, a number of buffer components, optionally a wetting agent and/or one or more other compounds inhibiting drying of the solution in a crystalline form, which aqueous solution is allowed to dry on the adhesive surface. After exposure the photosensitive material is contacted with an aqueous solution of a metal salt while the exposure result is converted in physically developable or electroless intensifiable metal nuclei and is subsequently contacted with a non-stabilized physical developer and/or an electroless metal-plating bath.

A drawback of this material is that the vitreous coating is quite soluble in water necessitating a large excess of the reacting components so as to obtain a sufficient number of nuclei on the adhesive. A second drawback is the presence of butter components, wetting agents and thickeners so that the water purification is impeded. One is bound to a non-stabilized development; stabilized development is not suitable because for the manufacture of external images the metal nuclei iocated on the surface are shielded by the surface active material serving as a stabilizer so that the development is inhibited. A drawback of a non-stabilized developer is that it is only durable for a short time and gives rise to strong contamination.

A method of manufacturing electrically conducting metal patterns by photographic process is known from UK Pat. No. 1,236,752 in which a photosensitive material is used consisting of a hydrophobic support coated with a coating of a resinous binder in which solid finely dispersed particles of a photosensitive compound are present. This photosensitive compound is chosen from the groups of photosensitive ferric compounds, organic photosensitive compounds whose light reaction product can separate metal by reduction from metal ions, and photosensitive compounds whose light reaction product can separate mercury from mercurous ions under disproportioning of these ions. Also these materials can only be intensified by a non-stabilized development. According to UK Pat. No. 1,229,935 a photosensitive material is used comprising a hydrophobic support coated with a coating of a resinous binder in which solid finely dispersed particles of a photosensitive semiconducting oxide are homogeneously distributed, the light reaction product of said photosensitive semiconducting oxide being capable of separating copper and/or a metal which is nobler than copper from a solution of the relevant metal salt. The drawback of both methods is that the accessibility of the photosensitive material for the aqueous baths is poor so that it is necessary to work with high concentrations of photosensitive material and nuclei-forming agents.

According to UK Pat. No. 1,338,435 this has been improved for the material comprising photosensitive semiconducting oxide by subjecting the resin with the photosensitive compounds dispersed therein to a controlled superficial attack of the resin in such manner that due to this attack a thickness of between approximately 0.1 and 1 $\mu m$ is etched off the coating. A drawback of the use of this material is the limitation of the resolving power due to scattering of light on the dispersed particles and by roughening of the surface. A further drawback is that the unused photosensitive semiconducting compound cannot be removed so that the durability of the ultimately obtained product is detrimentally influenced. Additionally there is the drawback of using an aggressive roughening bath which requires provisions for water purification. Also in this method a non-stabilized physical developer is used.

According to the invention the method of manufacturing an external, electrically conducting metal pattern on a coating which is at least non-conducting on its surface and which may be incorporated into a support for the pattern or may be incorporated into an adhesive medium on a support for the pattern in which coating there is dispersed in an organic binder an organic photosensitive compound of the type of photosensitive compounds capable of forming a light reaction product upon exposure to light and which light reaction product is capable of separating metal from solutions of the relevant metal salts in the form of a physical developable or electroless intensifiable metal nuclei image is characterized in that a photosensitive compound is chosen which is soluble in at least one organic solvent in which the organic binder material of the coating is soluble or can swell, while at least one of the liquids employed in converting the light reaction product into the ultimate metal pattern comprises at least one water-miscible organic solvents in addition to water in a mixing ratio in parts by volume of the total of organic solvents and water of between 1:10 and 2:1, said mixture being capable of causing the organic binder of the coating to swell to some extent. It was surprisingly found that a stabilized developer can be used within the scope of the invention. Apparently the metal nuclei are not shielded in this case.

According to a preferred embodiment it is possible to manufacture the starting material suitable for performing the method according to the invention in such a manner that the photosensitive compound is incorporated in the desired hydrophobic binder by swelling and diffusion by means of a solution of the photosensitive compound in an organic solvent.

A possible manufacture of the starting material is also that according to which a bearer coating is wetted with a solution comprising both the photosensitive compound and the binder whereafter the coating is dried.

According to the method of the invention a nuclei image is obtained which can be intensified by means of a stabilized physical developer and in which all previously mentioned drawbacks are obviated.

The photosensitive compounds eminently suitable within the scope of this invention are the diazosulfides known from U.S. Pat. No. 3,578,537.

After exposure of the photosensitive material it is contacted with a solution of metal salts in a solution which in addition to water comprises one or more organic solvents miscible with water for forming the metal nuclei image, which mixture must be capable of causing the binder to swell to some extent. The organic solvents suitable for this purpose are inter alia for a binder based on polyester or epoxyresin, chloroform, toluene, ethylacetate, alcohols or ketones, solely or mixed.

The stabilized physical developer with which the nuclei are developed preferably comprises also such a solvent. The physical development may then be continued until the nuclei image is just developed whereafter, for example, an electroless metal plating with copper is performed. It is alternatively possible to develop the nuclei image until it is electrically conducting whereafter it can be intensified by electroplating with, for example, copper or nickel.

The invention will be described in greater detail with reference to some examples.

EXAMPLE 1

A 50 $\mu$m thick foil of polyethyleneterephtelate is provided with an adhesive coating which in a wet state has a thickness of 36 $\mu$m, with the aid of a fluted handroller. The adhesive solution has the following composition:

45 g of a polyester resin prepared from terephtalic acid and propyleneglycol in 1,1,2-trichloroethane
3 g aluminium silicate powder (mean particle size 35 nm)
3 g $SiO_2$ powder (mean particle size 5 nm)
7.7 g of a hardener consisting of difenylmethanediisocyanate
255 g dichloromethane.

Added to the adhesive are
(a) 9.4 g $4NO_2$ benzenediazo tertiary butylsulfide
(b) 0.78 g of the same photosensitive compound.

The photosensitive compound is added to the solution while stirring immediately before use. After the foil is coated with this adhesive it is dried for 10 minutes at 75° C. in a furnace having a forced air circulation and cooled to room temperature.

The coating thickness of the dried adhesive is 2-4 $\mu$m.

The materials (a) and (b) in contact with a test negative of a printed circuit pattern are exposed for 15 and 30 seconds respectively with the aid of a 125 W high pressure mercury vapour lamp at a distance of 80 cm.

Subsequently the exposed material is immersed for 2 seconds in a nuclei-forming bath of the following composition:

0.005 mol/l mercurous nitrate and
0.03 mol/l silver nitrate in a solvent comprising water, isopropanol and ethylacetate in a ratio by volume of 3:2:1. Subsequently rinsing takes place for 2 seconds in a solvent of the same composition followed by a development for 2 minutes at 20° C. in a stabilized physical developer of the composition:
0.1 mol/l ferrous ammoniumsulfate ($6H_2O$)
0.04 mol/l ferric nitrate ($9H_2O$)
0.05 mol/l citric acid
0.05 mol/l silver nitrate
0.008% by weight of "Armac 12D"
0.008% by weight of "Lissapol N"
in a solvent comprising water and isopropanol in a volume ratio of 9:1.

"Armac 12D" is an anionic surface active compound comprising approximately 90% of dodecylamineacetate, 9% of tetradecylamineacetate and the remainder comprising acetates of higher alkylamines.

"Lissapol N" is a non-ionic surface active material which is a condensation product of alkylphenols and ethylene oxide.

Subsequently the developed material is rinsed for 1 minute in running water and dried. The surface resistance is less than 50$\Omega$ per square which is sufficient to intensity the pattern with copper by means of electroplating in a conventional copper-plating bath.

The adhesion of a 20 $\mu$m thick copper track is 35 g/mm (a) and 70 g/mm (b).

EXAMPLE 2

A 50 $\mu$m thick polyethyleneterephtalate foil as described in Example 1 is coated with an adhesive by means of the adhesive solution of Example 1 diluted per 100 g with 50 g of a mixture comprising
25 g dioxane
12.5 g dichloromethane and
12.5 g methylglycolacetate.

Per 100 g of the diluted adhesive solution 0.5 g of 4-nitrobenzenediazo-t-butylsulfide is added and dissolved. After coating of the foil with this solution it is dried for 10 minutes at 70° C. in a furnace with forced air circulation. The foil is exposed at a distance of 40 cm from a 125 W HPR lamp for 60 seconds behind a pattern negative. The exposed foil is immersed for 2 seconds in a nuclei-forming bath comprising 0.005 mol/l of mercurous nitrate and 0.01 mol/l of $AgNO_3$ in a solvent of water-isopropanol-ethylacetate in the volume ratio of 4:3:1, developed for 1 minute at 20° C. in the developer of Example 1 and copper-plated to 20 $\mu$m. The adhesion of the copper track is comparable with that of example 1(b).

A similar result is obtained with the same nuclei-forming bath comprising as a solvent a mixture of water and isopropanol in the volume ratio 1:1.

EXAMPLE 3

A polyethyleneterephtalate foil as in Example 1 is coated with a photosensitive adhesive. The adhesive solution comprises
45 g of a polyester resin prepared from terephtalic acid and propyleneglycol in 1,1,2-trichloroethane
7.7 g
7.7 g of hardener consisting of difenylmethanediisocyanate
255 g of dichloromethane.

Per 100 g of this solution 0.5 g of 4-nitro-benzenediazo-t-butylsulfide is added and dissolved while stirring. After drying for 10 minutes at 70° C. and cooling the foil is exposed for 60 seconds behind a negative at a distance of 40 cm from a 125 W HPR lamp and subsequently further treated in the same way as in Example 1. The result is comparable.

EXAMPLE 4

A 50 $\mu$m thick polyethylenterephtalate foil is provided with an adhesive coating which in a wet state is 36 $\mu$m thick. The adhesive solution has the following composition:
45 g polyester resin prepared from terephtalic acid and propyleneglycol in 1,1,2-trichloroethane
3 g aluminiumsilicate powder (mean particle size 35 nm)
3 g $SiO_2$ powder (mean particle size 5 nm)
7.7 g difenylmethanedi-isocyanate 76 g dioxane
38 g methylglycolacetate
293 g dichloromethane.

After the provision of the adhesive isolution on the foil it is dried for 10 minutes at 70° C. and cooled to room temperature. Subsequently the material is rendered photosensitive by soaking it for 5 seconds in a solution of (a) 0.1 mol/l and (b) 0.05 mol/l of 4-nitrobenzenediazo-t-butylsulfide in a mixture of equal parts by volume of isopropanol and ethylacetate. After soaking the material is rubbed off between rubber strips and exposed for 60 seconds in contact with a test negative of a printed circuit pattern at a distance of 40 cm from a 125 W HPR lamp. The further treatment is effected as described with reference to Example 2. The results are equivalent thereto as regards appearance and adhesion.

EXAMPLE 5

A 50 μm thick polyamide foil is treated in the same manner as in Example 4 and is coated with an adhesive and subsequently rendered photosensitive by soaking it in a mol/l solution of 4-nitro-benzenediazo-t-butylsulfide in ethylacetate. The photosensitive material is exposed for 15 seconds behind a negative at a distance of 80 cm from a 125 W HPR lamp and subsequently immersed for 2 seconds in a nuclei-forming bath comprising 0.005 mol/l mercurous nitrate and 0.03 mol/l silver nitrate in a water-ethanol mixture of 1:1 in parts by volume. Subsequently the nucleated foil is developed for 90 seconds at 20° C. in a liquid comprising 0.025 mol/l metol
0.1 mol/l citric acid
0.01 mol/l silver nitrate in a water ethanol mixture of 1:1 in parts by volume and copper-plated to 20 μm. The result is equivalent to that of Example 1(b).

EXAMPLE 6

A 50 μm thick polyethyleneterephthalate foil is provided with an adhesive coating as in Example 4 and rendered photosensitive with the aid of 0.1 mol/l 4-nitro-benzenediazo-t-butylsulfide in isopropanol. The exposure is effected for 15 seconds at a distance of 80 cm from a 125 W HPR lamp. After exposure the foil is immersed for 2 seconds in a solution comprising.

0.005 mol/l mercurous nitrate and 0.03 mol/l silver nitrate in a mixture of water-isopropanol-ethylacetate in a volume ratio of 4:3:1. Subsequently developing takes place for 10 minutes at 20° C. in a developer of the composition 0.1 mol/l ferrous ammoniumsulfate
0.04 mol/l ferric nitrate
0.05 mol/l citric acid
0.05 mol/l silver nitrate in water and electrolytically copper-plated. The result is again equivalent.

EXAMPLE 7

A 50 μm thick polyimide foil is provided with an adhesive coating and rendered photosensitive as described in Example 4 under (a). The material in contact with a test negative is exposed for 15 seconds at a distance of 40 cm from a 125 W HPR lamp and immersed for 2 seconds in a nuclei-forming bath of Example 2. Subsequently the foil is rinsed in the same solvent and developed for 1 minute at 20° C. in the developer of Example 1. Finally the electrically conducting silver image is electroless copper-plated for 30 minutes in the bath heated to 70° C. and comprising per liter of water:

0.03 mol/l $CuSO_4.5H_2O$
0.05 mol/l ethylenediaminetetraacetic acid Na salt
0.09 mol/l formaline
0.2% by weight of the polyoxyethylene compound "Triton QS 44" of the firm Rohm & Haas.

EXAMPLE 8

A 50 μm thick polyethyleneterephtalate film is provided with an adhesive coating and rendered photosensitive as described in Example 4. The film is provided with nuclei as in Example 7 and subsequently physically developed for 15 seconds at 20° C. in the developer of Example 1. Before intensifying the silver image with copper in an electroless manner it is exchanged for palladium by soaking the foil for 60 seconds in a $PdCl_2$ solution comprising per liter 2 g $PdCl_2$
20 ml concentrated hydrochloric acid
1% by weight of glycerine and
0.2% by weight of "Lissapol N."

After rinsing electroless copper-plating with an equivalent result takes place in accordance with the process as described under Example 7.

EXAMPLE 9

A plate of glass fibre-reinforced epoxy resin comprising dicyanediamide as a hardener is rendered photosensitive by soaking it for 5 seconds in a solution comprising 0.1 mol/l 4-nitrobenzenediazo-t-butylsulfide, dissolved in a mixture of equal parts by volume of isopropanol-ethyl-acetate. After drying the material is exposed in contact with a test negative for 15 seconds at a distance of 40 cm from a 125 W HPR lamp. The exposed material is provided with nuclei in the same manner as in Example 2 and developed in a developer as in Example 1 or in a developer of the following composition 0.1 mol/l metol
0.1 mol/l citric acid
0.05 mol/l silver nitrate
0.008% by weight of "Armac 12D"
0.008% by weight of "Lissapol N" in a mixture of water isopropanol 9:1 (in parts by volume). After copper-plating a result is obtained in both cases which, qualitatively, is equivalent to those obtained in Examples 1–6.

EXAMPLE 10

A 50 μm thick polyethyleneterephtalate foil is coated with an adhesive, which in a wet state has a thickness of 36 μm, with a 20% solution of an epoxybutadieneacrylonitrile adhesive in methylethylketone to which per 50 g solution 70 mg of a 5% polyamine hardener is added. The adhesive consists of 2 parts by weight of a bisphenol-A-epoxy resin with an epoxy equivalent of 450–500 and 1 part by weight of a butadieneacrylonitrile copolymer in a molecular ratio of 2 butadiene-1,3 and 1 acrylonitrile. After coating the foil is dried for 45 minutes at 180° C. in a furnace having a forced air circulation and subsequently rendered photosensitive with a 0.1 mol/l solution of 3,5 dichloro-benzenediazo-t-butylsulfide in ethanol. After soaking for 10 seconds the foil is rubbed off between rubber strips. The photosensitive material is subsequently exposed for 15 seconds behind a test negative of a printed circuit pattern at a distance of 40 cm from a 125 W HPR lamp. Subsequently the foil is immersed for 2 seconds in the nuclei-forming bath of Example 2. Finally the nuclei image is physically developed after rinsing in the same solvent in the developing bath of Example 1 and intensified by electroplating. The result is also equivalent to those of Examples 1–6.

The nuclei-forming solution may alternatively have as a solvent a mixture of water-ethanol and methylethylketone in a volume ratio of 3:2:1. The developer may as a solvent also comprise water-ethanol in the volume ratio 9:1.

EXAMPLE 11

A 50 μm thick foil of polyethyleneterephtalate is provided with an adhesive coating by means of a fluted handroller with the aid of a solution of the following composition:
  45 g of the polyester resin of Example 1
  3 g aluminiumsilicate powder (mean particle size 35 nm)
  3 g SiO$_2$ powder (mean particle size 5 nm)
  7.7 g of a hardener consisting of difenylmethanedi-isocyanate
  322 g dichloromethane
  67 g methylglycolacetate
  134 g dioxane
  38.3 g N,N dimethylformamide and
  3.1 g sodium salt of 2,5 diethoxybenzenediazosulfonic acid.

After the foil is coated with this adhesive it is dried for 30 minutes at 100° C. in a furnace having a forced air circulation and subsequently cooled to room temperature. In contact with a negative the material is exposed for 60 seconds with th aid of a 125 W high pressure mercury vapour lamp placed at a distance of 40 cm. Subsequently the exposed material is immersed for 2 seconds in a nuclei-forming bath of the following composition per liter: 0.005 mol mercurous nitrate and 0.01 mol silver nitrate in a mixture of water and ethanol in a volume ratio of 2:1. Subsequently rinsing takes place for 2 seconds in a solvent of the same composition followed by 2 minutes of development in the developer of Example 1 in which, however, a mixture of water and ethanol in the volume ratio 9:1 is used as a solvent . Subsequently the developed material is rinsed for 1 minute in running water and dried. The electrically conducting silver image may be intensified by copper-plating or electroless copper-plating as in Examples 1 and 7.

EXAMPLE 12

A 50 μm thick foil of polyethyleneterephtalate is provided with an adhesive in the manner of Example 12. The adhesive solution has the following composition:
  45 g of the polyester resin of Example 1
  3 g aluminiumsilicate powder
  3 g SiO$_2$ powder both of the quality as in Example 1
  7.7 g difenylmethanedi-isocyanate
  331.5 g dichloromethane
  76.5 g methylglycolacetate
  153 g dioxane
  3.1 g p-nitrobenzenediazo-t-butylsulfide
  1.2 g erythrosine-extra blue (sensitizer).

After the foil is coated with this adhesive it is dried for 10 minutes at 70° C. and cooled to room temperature. In contact with a negative the material is exposed for 120 seconds with the aid of a 125 W high pressure mercury vapour lamp placed at a distance of 8 cm and having a green filter placed in front of it. The nuclei formation and development are then effected in the manner described in Example 12, but the development is 1 minute instead of 2. After copper-plating a result is again obtained which is comparable with those of the previous Examples.

EXAMPLE 13

A 50 μm thick foil of polyethylenetephtalate is provided with an adhesive in the manner as in Example 12 by means of an adhesive solution of the following composition:
  45 g of the polyester resin of Example 1
  3 g aluminium silicate powder
  3 g SiO$_2$ powder both of the quality of Example 1
  7.7 g difenylmethanedi-isocyanate
  333.4 g dichloromethane
  78.4 g methylglycolacetate
  156.8 g dioxane After providing the adhesive it is dried for 10 minutes at 70° C. and cooled to room temperature. Subsequently the material is rendered photosensitive by drawing it up from a solution comprising per liter 0.1 mol of 3,5-dichloro-4-dimethylaminobenzenediazo-tertiary butylsulfide in ethanol.

The material rendered photosensitive is exposed in contact with a negative for 60 seconds at a distance of 40 cm from a 125 W HPR lamp. Subsequently it is immersed for 2 seconds in the nuclei-forming bath of Example 12 followed by rinsing for 2 seconds in the same solvent. Subsequently it is developed for 60 seconds in the developer of Example 1, but with the solvent water-ethanol in the volume ratio of 9:1 and rinsed for 1 minute in running water. The developed image is bleached off by immersing it for 10 seconds in a bath of the following composition per liter:
  52.4 g potassium permanganate
  32 ml of concentrated sulfuric acid (d=1.84)

The foil is then immersed for 10 seconds in a 10% by weight ferric ammoniumsulfate solution, 10 seconds in running demineralized water, 10 seconds in a 10% by weight citric acid solution and 1 minute in running demineralized water. The foil is dried in a cooled stream of air and uniformly exposed for 90 seconds under a 125 W HPR lamp at a distance of 40 cm.

Nuclei formation and development are effected as described with reference to Example 12. A conducting positive image is obtained.

What is claimed is:

1. In the method of manufacturing an external electrically conducting metal pattern on a hydrophobic support which is at least superficially non-conducting, which method comprises subjecting to actinic radiation desired areas of a photosensitive coating adhering to said support and containing uniformly dispersed in an organic binder selected from the group consisting of polyesters and epoxy resins a photosensitive material selected from the group consisting of diazosulfides and diazosulfonates, and capable, upon exposure to acinic light, of producing a light reaction product which in the presence of water is capable of forming free silver and mercury metal from water-soluble silver and mercurous compounds to thereby form light reaction products at exposed areas of said coating, exposing said coating to treatment with at least one water-soluble salt selected from the group consisting of a water-soluble mercury salt and a water soluble silver salt in the presence of water to thereby form a latent metal image and then physically developing said latent metal image by treatment with an aqueous solution of a metal salt and a reducing agent for said metal salt, the improvement wherein at least in the step wherein the coating is exposed to treatment with at least one water-soluble salt in the presence of water to form a latent image in place of water there is employed a mixture of water and at least one water-soluble liquid organic solvent for said photosensitive material selected from the group consisting of chloroform, toluene, ethylacetate, liquid alcohols and liquid ketones in a ratio by volume of the total amount of organic solvent to water of 1:10 to 2:1 and wherein said mixture is capable of swelling said binder.

2. The method of claim 1 wherein the photo-sensitive compound is an aromatic diazosulfide.

3. The method of claim 2 wherein the water-soluble salt is a water-soluble mercurous salt.